(12) United States Patent
Flemming et al.

(10) Patent No.: US 11,161,773 B2
(45) Date of Patent: Nov. 2, 2021

(54) METHODS OF FABRICATING PHOTOSENSITIVE SUBSTRATES SUITABLE FOR OPTICAL COUPLER

(71) Applicant: 3D GLASS SOLUTIONS, INC., Albuquerque, NM (US)

(72) Inventors: Jeb H. Flemming, Albuquerque, NM (US); Jeff A. Bullington, Albuquerque, NM (US); Luis C. Chenoweth, Albuquerque, NM (US); Roger Cook, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 120 days.

(21) Appl. No.: 16/092,178

(22) PCT Filed: Apr. 7, 2017

(86) PCT No.: PCT/US2017/026662
§ 371 (c)(1),
(2) Date: Oct. 8, 2018

(87) PCT Pub. No.: WO2017/177171
PCT Pub. Date: Oct. 12, 2017

(65) Prior Publication Data
US 2019/0161389 A1 May 30, 2019

Related U.S. Application Data

(60) Provisional application No. 62/319,910, filed on Apr. 8, 2016.

(51) Int. Cl.
*G03F 7/004* (2006.01)
*G02B 6/26* (2006.01)
(Continued)

(52) U.S. Cl.
CPC .............. *C03C 3/095* (2013.01); *C03C 3/085* (2013.01); *C03C 4/04* (2013.01); *G02B 1/00* (2013.01);
(Continued)

(58) Field of Classification Search
CPC ........... C03C 4/04; C03C 3/095; C03C 3/085; G02B 1/00; G02B 6/26; G02B 6/423;
(Continued)

(56) References Cited

U.S. PATENT DOCUMENTS 2,515,940 A  7/1950  Stookey
2,515,941 A  7/1950  Stookey
(Continued)

FOREIGN PATENT DOCUMENTS

CN   1562831      4/2004
CN   105938928    9/2016
(Continued)

OTHER PUBLICATIONS

Chou et al., "Design and demonstration of micro-mirrors and lenses for low loss and low cost single mode fiber coupling in 3D glass photonic interposers", Proc 2016 IEEE 66th Electronic Components and Technology Conference (ECTC), Las Vegas, NV pp. 497-503 (May-Jun. 2016).*

(Continued)

*Primary Examiner* — Martin J Angebranndt
(74) *Attorney, Agent, or Firm* — Edwin S. Flores; Chalker Flores, LLP

(57) ABSTRACT

The present invention provides a method to fabricate an optical coupler comprising the steps of: preparing a photosensitive glass substrate comprising at least silica, lithium oxide, aluminum oxide, and cerium oxide; masking a halftone design with variation in optical density to delineate an optical element in the glass; exposing the photosensitive (Continued)

glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; and etching the glass-crystalline substrate with an etchant solution to form the one or more optical elements.

16 Claims, 2 Drawing Sheets

(51) Int. Cl.
| | |
|---|---|
| G02B 6/32 | (2006.01) |
| C03C 4/04 | (2006.01) |
| C03C 3/095 | (2006.01) |
| G02B 1/00 | (2006.01) |
| G02B 6/42 | (2006.01) |
| G02B 3/00 | (2006.01) |
| G03F 7/00 | (2006.01) |
| C03C 3/085 | (2006.01) |
| G02B 3/08 | (2006.01) |

(52) U.S. Cl.
CPC ............ *G02B 3/0087* (2013.01); *G02B 6/26* (2013.01); *G02B 6/423* (2013.01); *G02B 6/4204* (2013.01); *G03F 7/0005* (2013.01); *G03F 7/0042* (2013.01); *G02B 3/08* (2013.01); *G02B 6/32* (2013.01); *G02B 6/4214* (2013.01)

(58) Field of Classification Search
CPC ...... G02B 6/4204; G02B 6/4214; G02B 6/32; G02B 3/0087; G02B 3/085; G02B 3/095; G02B 3/08
See application file for complete search history.

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A * | 4/1984 | Fujita ............... C03C 15/00 216/87 |
| 4,514,053 A | 4/1985 | Borelli et al. |
| 4,537,612 A | 8/1985 | Borelli et al. |
| 4,647,940 A | 3/1987 | Traut et al. |
| 4,692,015 A * | 9/1987 | Loce ............... G02B 3/00 355/1 |
| 4,788,165 A | 11/1988 | Fong et al. |
| 4,942,076 A | 7/1990 | Panicker et al. |
| 5,078,771 A | 1/1992 | Wu |
| 5,147,740 A | 9/1992 | Robinson |
| 5,212,120 A | 5/1993 | Araujo et al. |
| 5,215,610 A | 6/1993 | Dipaolo et al. |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A * | 5/1999 | Tsukamoto ......... G02B 6/2551 385/130 |
| 5,919,607 A | 7/1999 | Lawandy et al. |
| 5,998,224 A | 12/1999 | Rohr et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,485,690 B1 | 11/2002 | Pfost et al. |
| 6,511,793 B1 | 1/2003 | Cho et al. |
| 6,514,375 B2 | 2/2003 | Kijima |
| 6,562,523 B1 * | 5/2003 | Wu ............... C03C 3/093 430/13 |
| 6,678,453 B2 | 1/2004 | Bellman et al. |
| 6,686,824 B1 | 2/2004 | Yamamoto et al. |
| 6,771,860 B2 * | 8/2004 | Trezza ............... G02B 6/4249 385/52 |
| 6,783,920 B2 | 8/2004 | Livingston et al. |
| 6,824,974 B2 | 11/2004 | Pisharody et al. |
| 6,843,902 B1 | 1/2005 | Penner et al. |
| 6,875,544 B1 | 4/2005 | Sweatt et al. |
| 6,932,933 B2 | 8/2005 | Halvajian et al. |
| 6,977,722 B2 | 12/2005 | Wohlstadter et al. |
| 7,033,821 B2 | 4/2006 | Kim et al. |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnsworth et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 10,070,533 B2 | 9/2018 | Flemming et al. |
| 10,201,901 B2 | 2/2019 | Flemming et al. |
| 2001/0051584 A1 | 12/2001 | Harada et al. |
| 2002/0015546 A1 * | 2/2002 | Bhagavatula ......... G02B 6/124 385/10 |
| 2002/0086246 A1 | 7/2002 | Lee |
| 2002/0100608 A1 | 8/2002 | Fushie et al. |
| 2003/0025227 A1 | 2/2003 | Daniell |
| 2003/0124716 A1 | 7/2003 | Hess et al. |
| 2003/0135201 A1 | 7/2003 | Gonnelli |
| 2003/0156819 A1 | 8/2003 | Pruss et al. |
| 2003/0174944 A1 * | 9/2003 | Dannoux ............. G02B 6/3664 385/33 |
| 2003/0228682 A1 | 12/2003 | Lakowicz et al. |
| 2003/0231830 A1 * | 12/2003 | Hikichi ............... G02B 6/262 385/33 |
| 2004/0008391 A1 | 1/2004 | Bowley et al. |
| 2004/0020690 A1 | 2/2004 | Parker et al. |
| 2004/0155748 A1 | 8/2004 | Steingroever |
| 2004/0171076 A1 | 9/2004 | Dejneka et al. |
| 2004/0184705 A1 * | 9/2004 | Shimada ............... G02B 6/423 385/14 |
| 2004/0198582 A1 | 10/2004 | Borelli et al. |
| 2004/0227596 A1 | 11/2004 | Nguyen et al. |
| 2005/0089901 A1 | 4/2005 | Porter et al. |
| 2005/0105860 A1 * | 5/2005 | Oono ............... G02B 6/4214 385/88 |
| 2005/0150683 A1 | 7/2005 | Farnworth et al. |
| 2005/0170670 A1 | 8/2005 | King et al. |
| 2005/0277550 A1 | 12/2005 | Brown et al. |

(56) References Cited

U.S. PATENT DOCUMENTS

| | | |
|---|---|---|
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Debrow et al. |
| 2006/0171033 A1* | 8/2006 | Schreder ............... B29D 11/00 |
| | | 359/566 |
| 2006/0177866 A1 | 8/2006 | Utermohlen et al. |
| 2006/0188907 A1 | 8/2006 | Lee et al. |
| 2006/0193214 A1* | 8/2006 | Shimano ................ G11B 7/123 |
| | | 369/44.12 |
| 2006/0283948 A1 | 12/2006 | Naito |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1* | 11/2007 | Nakagawa ......... H01L 27/14621 |
| | | 250/208.1 |
| 2007/0279837 A1 | 12/2007 | Chow et al. |
| 2007/0296520 A1 | 12/2007 | Hosokawa et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1* | 9/2008 | Tamura ................. G02B 6/4214 |
| | | 385/33 |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemminng et al. |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1* | 4/2012 | Grego ................... A61B 5/0071 |
| | | 250/458.1 |
| 2012/0161330 A1 | 6/2012 | Hlad et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0209026 A1* | 8/2013 | Doany ..................... G02B 6/34 |
| | | 385/14 |
| 2013/0233202 A1 | 9/2013 | Cao et al. |
| 2013/0278568 A1 | 10/2013 | Lasiter et al. |
| 2013/0308906 A1* | 11/2013 | Zheng .................... G02B 6/4206 |
| | | 385/49 |
| 2013/0337604 A1 | 12/2013 | Ozawa et al. |
| 2014/0002906 A1* | 1/2014 | Shibuya .................. B29C 33/42 |
| | | 359/618 |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0145326 A1 | 5/2014 | Lin et al. |
| 2014/0169746 A1* | 6/2014 | Hung ....................... G02B 6/42 |
| | | 385/89 |
| 2014/0203891 A1 | 7/2014 | Yazaki |
| 2014/0247269 A1 | 9/2014 | Berdy et al. |
| 2014/0272688 A1* | 9/2014 | Dillion ..................... G03F 1/50 |
| | | 430/13 |
| 2014/0367695 A1 | 12/2014 | Barlow |
| 2015/0048901 A1 | 2/2015 | Rogers |
| 2015/0071593 A1* | 3/2015 | Kanke .................. G02B 6/4214 |
| | | 385/89 |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0181211 A1 | 6/2016 | Kamagaing et al. |
| 2016/0185653 A1* | 6/2016 | Fushie ................. C03C 10/0027 |
| | | 428/131 |
| 2016/0254579 A1 | 9/2016 | Mills |
| 2016/0265974 A1* | 9/2016 | Ertel ..................... G01J 3/0291 |
| 2016/0320568 A1* | 11/2016 | Haase .................. G02B 6/4214 |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0323485 A1 | 11/2018 | Gnanou et al. |
| 2019/0280079 A1 | 7/2019 | Bouvier et al. |
| 2020/0275558 A1 | 8/2020 | Fujita |

FOREIGN PATENT DOCUMENTS

| | | | |
|---|---|---|---|
| CN | 210668058 U | 6/2020 | |
| DE | 102004059252 | 6/2006 | |
| EP | 0311274 | 12/1989 | |
| EP | 0507719 A1 | 10/1992 | |
| EP | 0685857 B1 | 12/1995 | |
| EP | 0949648 A1 | 10/1999 | |
| EP | 1683571 | 6/2006 | |
| JP | 56-155587 | 12/1981 | |
| JP | 61-149905 | * 7/1986 | |
| JP | 61-231529 | * 10/1986 | |
| JP | 62-202840 | * 9/1987 | |
| JP | 63-128699 A | 6/1988 | |
| JP | H393683 A | 4/1991 | |
| JP | 05-139787 | * 6/1993 | |
| JP | 08-026767 | * 1/1996 | |
| JP | 08-179155 | * 7/1996 | ............... G02B 6/32 |
| JP | 10007435 A | 1/1998 | |
| JP | 11-344648 | * 12/1999 | |
| JP | 2000228615 | 8/2000 | |
| JP | 2001-033664 | * 2/2001 | |
| JP | 2001206735 A | 7/2001 | |
| JP | 2005-215644 | * 8/2005 | |
| JP | 2005302987 A | 10/2005 | |
| JP | 2008252797 A1 | 10/2008 | |
| JP | 2013062473 A | 4/2013 | |
| JP | 2013-217989 | * 10/2013 | |
| JP | 2015-028651 | * 2/2015 | |
| JP | H08026767 | 1/2016 | |
| JP | 2018200912 A | 12/2018 | |
| KR | 101167691 | 7/2012 | |
| WO | 2007088058 A2 | 8/2007 | |
| WO | 2008119080 | 10/2008 | |
| WO | 2008154931 | 12/2008 | |
| WO | 2009029733 | 3/2009 | |
| WO | 2009062011 | 5/2009 | |
| WO | 2009126649 | 10/2009 | |
| WO | 2010011939 | 1/2010 | |
| WO | 2011100445 | 8/2011 | |
| WO | 20111109648 | 9/2011 | |
| WO | 2012078213 A1 | 6/2012 | |
| WO | 2014062226 A1 | 1/2014 | |
| WO | 2014043267 | 3/2014 | |
| WO | 2014062311 | 4/2014 | |
| WO | 2015108648 A1 | 7/2015 | |
| WO | 2015112903 | 7/2015 | |
| WO | 2015171597 | 11/2015 | |
| WO | 2017132280 | 8/2017 | |

(56) References Cited

FOREIGN PATENT DOCUMENTS

| WO | 2017147511 | 8/2017 |
|----|------------|--------|
| WO | 2017177171 | 10/2017 |

OTHER PUBLICATIONS

Machine translation of JP 62-202840 (1987).*
Machine translation of JP 08-026767 (1996).*
Aslan, et al., "Metal-Enhanced Fluorescence: an emerging tool in biotechnology" Current opinion in Biotechnology (2005), 16:55-62.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Geddes, et al., "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Technology Roadmap for Semiconductors, 2007 Edition, "Assembly and Packaging," 9 pages.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Extended European Search Report 17744848.7 dated Oct. 30, 2019, 9 pp.
Extended European Search Report 17757365.6 dated Oct. 14, 2019, 14 pp.
International Search Report and Written Opinion for PCT/US2019/50644 dated Dec. 4, 2019 by USPTO, 9 pp.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Azad, I., et al., "Design and Performance Analysis of 2.45 GHz Microwave Bandpass Filter with Reduced Harmonics," International Journal of Engineering Research and Development (2013), 5(11):57-67.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2018/068184 dated Mar. 19, 2019 by Australian Patent Office, 11 pp.
Papapolymerou, I., et al., "Micromachined patch antennas," IEEE Transactions on Antennas and Propagation, vol. 46, No. 2, 1998, pp. 275-283.
Grine, F. et al., "High-Q Substrate Integrated Waveguide Resonator Filter With Dielectric Loading," IEEE Access vol. 5, Jul. 12, 2017, pp. 12526-12532.
Hyeon, 1-J, et al., "Millimeter-Wave Substrate Integrated Waveguide Using Micromachined Tungsten-Coated Through Glass Silicon via Structures," Micromachines, vol. 9, 172 Apr. 9, 2018, 9 pp.
International Search Report and Written Opinion for PCT/US2020/026673 dated Jun. 22, 2020, by the USPTO, 13 pp.

(56) References Cited

OTHER PUBLICATIONS

Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
Topper, et al., "Development of a high density glass interposer based on wafer level packaging technologies," 2014 IEEE 64th Electronic Components and Technology Conference, May 27, 2014, pp. 1498-1503.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
International Search Report and Written Opinion for PCT/US2020/28474 dated Jul. 17, 2020 by the USPTO, 7 pp.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
International Search Report and Written Opinion for PCT/US2020/54394 dated Jan. 7, 2021 by the USPTO, 15 pp.
International Search Report and Written Opinion for PCT/US2021/27499 dated Jun. 16, 2021 by the USPTO, 7 pp.
International Search Report and Written Opinion for PCT/US2021/21371 dated May 20, 2021 by the USPTO, 10 pp.

\* cited by examiner

METHODS OF FABRICATING PHOTOSENSITIVE SUBSTRATES SUITABLE FOR OPTICAL COUPLER

CROSS-REFERENCE TO RELATED APPLICATIONS

This application is a National Stage of International Application of PCT/US2017/026662, filed Apr. 7, 2017, which claims the benefit of U.S. Provisional Application No. 62/319,910, filed Apr. 8, 2016. The contents of each of which are incorporated by reference in their entirety.

FIELD OF INVENTION

The present invention relates to a method to fabricate a glass structure and, in particular, a method for a monolithic optical coupler for directing light from a laser diode to an optical fiber glass-ceramic substrate for focusing, collimating, and imaging in general.

BACKGROUND ART

Photosensitive glass structures have been suggested for a number of micromachining and microfabrication processes such as integrated imaging elements in conjunction with other elements systems or subsystems, micro-lens, micro-lens arrays. Silicon microfabrication of traditional glass is expensive and low yield while injection molding or embossing processes produce inconsistent optical shapes and micro lenses. Silicon microfabrication processes rely on expensive capital equipment; photolithography and reactive ion etching tools that generally cost in excess of one million dollars each and require an ultra-clean, high-production silicon fabrication facility costing millions to billions more. Injection molding and embossing are less costly methods of producing a micro-lens but generate defects within the transfer or have differences due to the stochastic curing process.

This invention creates a cost effective glass ceramic optical coupling device based integrated lens, mirrors and waveguide elements. Where glass ceramic substrate has demonstrated capability to form such structures through the processing of both the vertical as well as horizontal planes either separately or at the same time to form three optical coupling devices or an array of devices.

SUMMARY OF THE INVENTION

The present invention includes a method to fabricate a substrate with one or more optical micro-lens by preparing a photosensitive glass substrate and further coating with one or more metals.

The present invention provides a method to fabricate an optical coupler comprising the steps of: preparing a photosensitive glass substrate comprising at least silica, lithium oxide, aluminum oxide, and cerium oxide; masking a halftone design with variation in optical density to delineate an optical element in the glass; exposing the photosensitive glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; and etching the glass-crystalline substrate with an etchant solution to form the one or more optical elements.

The present invention provides a method to fabricate an optical element comprising the steps of: preparing a photosensitive glass substrate comprising at least silica, lithium oxide, aluminum oxide, and cerium oxide; masking a digital mask consists of transparent and non-transparent elements to define a diffractive optical element in the glass; exposing at least one portion of the photosensitive glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; and etching the glass-crystalline substrate with an etchant solution to form the one or more micro-lens device(s).

The one or more optical elements may be one or more micro-lens. The photosensitive glass substrate may be 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$ and $A_{12}O_3$ not exceeding 13 weight %; 8-15 weight % $Li_2O$; and 0.001-0.1 weight % $CeO_2$. The optical element may be circular with a high optical density on the perimeter and low optical density in the center. The optical element may be a micro-lens comprising a high optical density on the perimeter and a low optical density in the center. The one or more optical elements provide the optical power. The halftone design provides the optical power of the optical element. The optical element may be a pattern of high optical density with concentric circles. The optical element may be a diffractive pattern of concentric circles. The optical element forms a diffractive optical micro-lens. The pattern of concentric circular circles provide the optical power of the optical element.

A method of fabrication and device made by preparing a photosensitive glass ceramic composite substrate comprising at least silica, lithium oxide, aluminum oxide, and cerium oxide, masking a design layout comprising one or more micro-lens on the photosensitive glass substrate, exposing at least one portion of the photosensitive glass substrate to an activating energy source, exposing the photosensitive glass substrate to a heating phase of at least ten minutes above its glass transition temperature, cooling the photosensitive glass substrate to transform at least part of the exposed glass to a crystalline material to form a glass-crystalline substrate and etching the glass-crystalline substrate with an etchant solution to form one or more angled channels, lens diffractive optical element waveguide and/or precision fiber guide.

BRIEF DESCRIPTION OF THE DRAWINGS

Further benefits and advantages of the present invention will become more apparent from the following description of various embodiments that are given by way of example with reference to the accompanying drawings.

DESCRIPTION OF THE INVENTION

Figure 1:
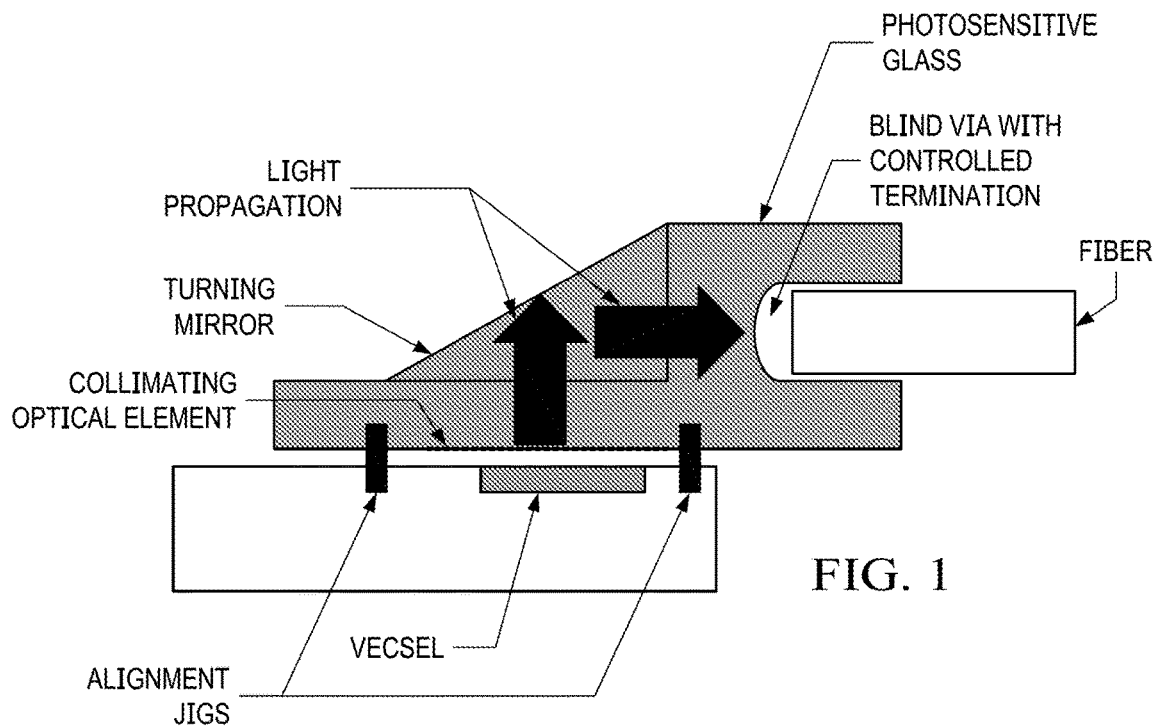
FIG. 1 is an image of the optical coupler of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

To address these needs, the present inventors developed a photosensitive glass ceramic (APEX® Glass ceramic) as a novel packaging and substrate material for semiconductors, RF electronics, microwave electronics, and optical imaging. APEX Glass ceramic is processed using first generation semiconductor equipment in a simple three step process and the final material can be fashioned into either glass, ceramic, or contain regions of both glass and ceramic. The APEX Glass ceramic possesses several benefits over current materials, including: easily fabricated high density vias, demonstrated microfluidic capability, micro-lens or micro-lens array, high Young's modulus for stiffer packages, halogen-free manufacturing, and economical manufacturing. Photosensitive glasses have several advantages for the fabrication of a wide variety of microsystems components. Microstructures have been produced relatively inexpensively with these glasses using conventional semiconductor processing equipment. In general, glasses have high temperature stability, good mechanical and electrical properties, and have better chemical resistance than plastics and many metals. To our knowledge, the only commercially available photosensitive glass is FOTURAN®, made by Schott Corporation and imported into the U.S. only by Invenios Inc. FOTURAN® comprises a lithium-aluminum-silicate glass containing traces of silver ions. When exposed to UV-light, within the absorption band of cerium oxide, the cerium oxide acts as sensitizers, absorbing a photon and losing an electron that reduces neighboring silver oxide to form silver atoms, e.g.,

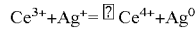

$$Ce^{3+}+Ag^+ = \text{?} \; Ce^{4+}+Ag^0$$

The silver atoms coalesce into silver nanoclusters during the baking process and induces nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air for FOTURAN®). The crystalline phase is more soluble in etchants, such as hydrofluoric acid (HF), than the unexposed vitreous, amorphous regions. In particular, the crystalline regions of FOTURAN® are etched about 20 times faster than the amorphous regions in 10% HF, enabling microstructures with wall slopes ratios of about 20:1 when the exposed regions are removed. See T. R. Dietrich et al., "Fabrication technologies for microsystems utilizing photosensitive glass," Microelectronic Engineering 30, 497 (1996), which is incorporated herein by reference.

Preferably, the shaped glass structure contains at least one of a micro-optic lens, a micro-optic element. The micro-optic lens is formed in one of three manners. First, the micro-optic lens can be fabricated by making a series of concentric circles to form a Fresnel lens. The index of refraction mismatch between the etched regions and the un-etched region of the concentric circles creates a diffractive optical element or Fresnel lens. Secondly, a Fresnel lens can be created by using a series of rings from a material that is deposited on the surface of the APEX Glass. As long as the concentric circles of the Fresnel lens have an index of refraction difference or a thickness difference, the Fresnel lens will apply the optical function to the incident electromagnetic radiation. The third approach is to etch a curved pattern or a step approximation of curved pattern. The curved or step approximation of curved pattern creates a lens where the power of the lens is given by the slope of the curvature and the specific optical function given by the overall shape of the structure.

FOTURAN® is described in information supplied by Invenios (the sole source U.S. supplier for FOTURAN®) and is composed of silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide ($Sb_2O_3$) or arsenic oxide ($As_2O_3$), silver oxide ($Ag_2O$) of 0.05-0.15% by weight, and cerium oxide ($CeO_2$) of 0.01-0.04% by weight. As used herein, the terms "APEX Glass ceramic", "APEX glass" or simply "APEX" is used to denote one embodiment of the glass ceramic composition of the present invention.

The present invention provides a single material approach for the fabrication of optical microstructures with photosensitive/photo-patternable APEX Glass for use in imaging applications by the shaped APEX Glass structures that are used for lenses and includes through-layer or in-layer designs.

Generally, glass ceramics materials have had limited success in microstructure formation plagued by performance, uniformity, usability by others and availability issues. Past glass-ceramic materials have a yield etch aspect-ratio of approximately 15:1. In contrast, APEX Glass has an average etch aspect-ratio greater than 50:1. This allows users to create smaller and deeper features. Additionally, our manufacturing process enables product yields of greater than 90% (legacy glass yields are closer to 50%). Lastly, in legacy glass ceramics, approximately 30% of the glass is converted into the ceramic state, whereas with APEX Glass ceramic this conversion is closer to 70%.

The present invention includes a method for fabricating a glass ceramic structure for use in forming angled structures, mirrors and glass ceramic materials used in electromagnetic transmission and filtering applications. The present invention includes an angled structure created in the multiple planes of a glass ceramic substrate, such process employing the (a) exposure to excitation energy such that the exposure occurs at various angles by either altering the orientation of the substrate or of the energy source, (b) a bake step and (c) an etch step. Angle sizes can be either acute or obtuse. The curved and digital structures are difficult, if not infeasible to create in most glass, ceramic or silicon substrates. The present invention has created the capability to create such structures in both the vertical as well as horizontal plane for glass ceramic substrates. The present invention includes a method for fabricating glass ceramic micro-lens structures for use in imaging. The lens structure can be coated with various metals or oxides, thin films or other materials to modify the index of refraction (e.g., mirrors) or transparent materials to create a lens. In optics, the refractive index (or index of refraction) of a substance (optical medium) is a number that describes how light, or any other radiation, propagates through that medium.

The present invention allows for the development of negative refractive index structures, which can occur if permittivity and permeability have simultaneous negative values. The resulting negative refraction offers the possibility of creating lenses and other exotic optical structures.

Ceramicization of the glass is accomplished by exposing the entire glass substrate to approximately 20 J/cm$^2$ of 310 nm light. When trying to create glass spaces within the ceramic, users expose all of the material, except where the glass is to remain glass. In one embodiment, the present invention provides a quartz-chrome mask containing a variety of concentric circles with different diameters.

The present invention includes a method for fabricating a glass ceramic structure for use in forming imaging structures, diffractive optical element, mirrors and micro-lens, micro-lens array in glass ceramic materials used in electromagnetic transmission and reflecting applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. This and other varied compositions are generally referred to as the APEX Glass.

The exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that has an aspect ratio of at least 30:1, and to provide a lens shaped glass structure. The mask for the exposure can be of a halftone mask that provides a continuous grey scale to the exposure to form a curved structure for the micro-lens. A digital mask used with the flood exposure can be used to produce a diffractive optical element or Fresnel lens. The exposed glass is then typically baked in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass substrate is then etched. The glass substrate is etched in an etchant, of HF solution, typically 5% to 10% by volume, wherein the etch-ratio of exposed portion to that of the unexposed portion is at least 30:1 when exposed with a broad spectrum mid-ultraviolet flood light, and greater than 30:1 when exposed with a laser, to provide a shaped glass structure with an anisotropic etch ratio of at least 30:1.

The optical coupler is the combination of a fiber alignment guide, tuning mirror, collimating optical element (such as a lens or diffractive optical element) and coupling optical element (such as a lens or diffractive optical element). These optical elements exist as discrete devices that are assembled by hand with low yield and poor performance. This invention offers the first monolithic structure created on a single photosensitive glass substrate without subsequent assembly. The monolithic optical coupler has an alignment jig for the VECSEL to be inserted or for external alignment jigs to mate up. On the inside of the jig is an optical element that collimates the emission from the VECSEL. The collimating optical element can be either a curved lens formed from etching or a series of etched grooves that create a diffractive lens. The collimated light travels to a turning mirror to reflect the light 90°. The reflected light is transmitted through the glass and pass through the controlled termination of the blind via. The controlled termination is a curved termination. The curved termination acts as a lens that images the light into the fiber that is held in the etched blind via. The cylindrical via is at least 5% greater in diameter than of the fiber. See FIG. 1.

Figure 2:
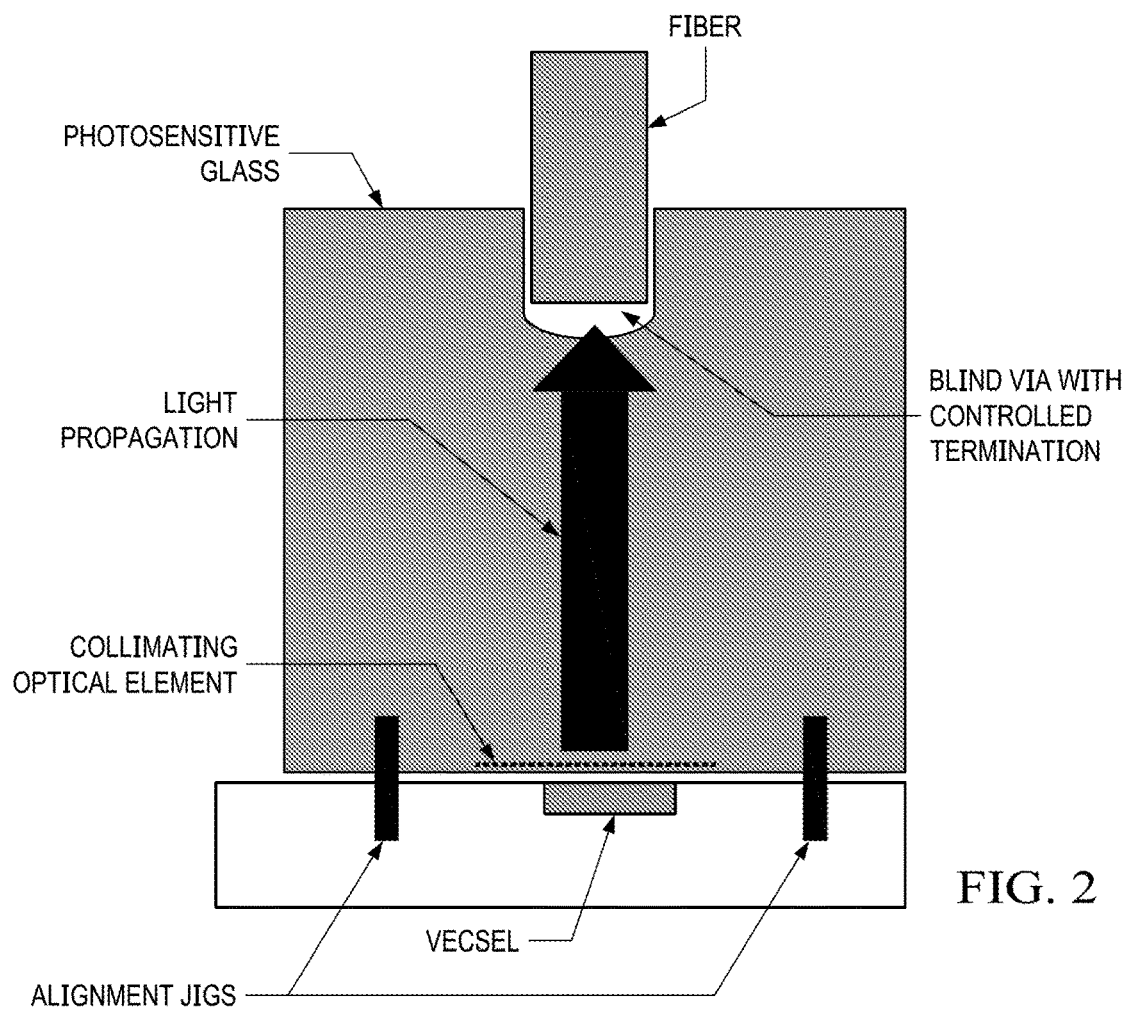
FIG. 2 is an image of a monolithic optical coupler of the present invention.
Figure 3:
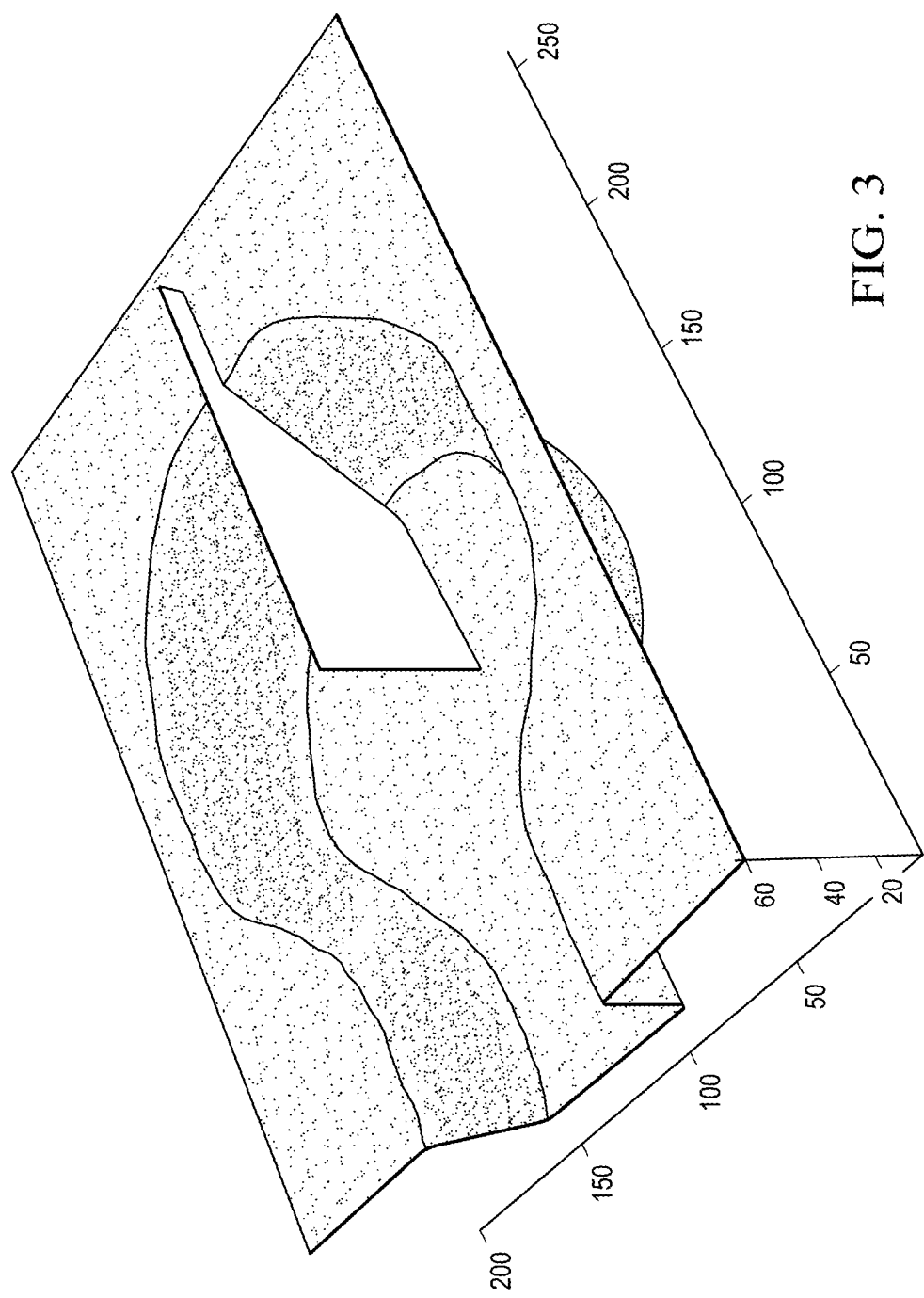
FIG. 3 is an image of the angled etched features of the present invention; the angles can be at any angle from 0-45 degrees.

A second version of the monolithic optical coupler has an alignment jig for the VECSEL to be inserted or for external alignment jigs to mate up. On the inside of the jig is an optical element in the photosensitive glass that collimates the emission from the VECSEL. The collimating optical element can be either a curved lens formed from etching or a series of etched grooves that create a diffractive lens. The collimated light form the VECSEL is transmitted the photosensitive glass where it passes through the controlled termination of the blind via. The controlled termination is a curved termination. The curved termination acts as a lens that images the light into the fiber that is held in the etched blind via. The cylindrical via is at least 5% greater in diameter than of the fiber. See FIG. 2.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

General Photoactive Glass Manufacturing Design Rules: Boron Oxide and Aluminum oxide basically conduct the same task within the glass melt. Boron oxide may also be in the form of anhydride boric acid ($H_3BO_3$), Borax Frits, Gerstley Borate/Colemanite, Boric Acid, Borax, and Ulexite. A 13 weight percent represents the high end of $B_2O_3$ in borosilicate glasses. Boron Oxide concentration range: Up to 13 weight percent. Aluminum oxide may be in the form of Alkali containing feldspars (such as Albite, $NaAlSi_3O_8$) or alumina hydrate. $Al_2O_3$ may be added by using kaolin or nepheline syenite (which contains feldspar). Up to 8 weight percent. This represents the high end of $Al_2O_3$ in borosilicate glasses crystallization Aluminum Oxide concentration range: up to 7 weight percent. Or more appropriately, the combination of Boron Oxide and Aluminum Oxide should not exceed 13 weight percent.

Potassium Oxide and Sodium Oxide basically conduct the same task within the glass melt. Potassium oxide: Helps lower melting point. Sometimes used to replace sodium in soda lime glasses. Range up to 16 weight percent as well.

May also be Potash ($K_2CO_3$). If used to replace $Na_2O$, typically makes the glass more chemically resistant.

Potassium Oxide concentration range: up to 16 weight percent. Sodium oxide helps lower melting point. Range up to 16 weight percent (common high end for soda lime glass). May also be soda ash ($Na_2CO_3$) or Glauber's Salt ($Na_2SO_4$). Sodium oxide concentration range: up to 16 weight percent. Or more appropriately, the combination of these two should not exceed 16 weight percent. Silica: concentration range: 60-85 weight percent.

Zinc oxide: Improves chemical resistance, lowers thermal expansion, adds elasticity. Works similarly with CaO. Up to 18 weight percent in E-Glass. Zinc Oxide concentration range: up to 18 weight percent. Lithium Oxide: Aids in nucleation. Can be lithium carbonate. Lithium Oxide concentration range: 8-15 weight percent.

Cerium Oxide: Electron Donor. Cerium oxide concentration range: up to 0.1 weight percent. Antimonium trioxide: Oxygen donor. Antimonium trioxide ($Sb_2O_3$) concentration range: up to 0.5 weight percent. Arsenic Oxide: Oxygen donor. Arsenic oxide ($As_2O_3$): Electron Donor. Arsenic Oxide concentration range: up to 0.1 weight.

Silver Oxide concentration range: up to 1 weight percent. Gold Oxide concentration range: up to 1 weight percent. Copper Oxide concentration range: up to 2 weight percent.

The above ingredients might be at least partially replaced with the following compounds: Calcium Oxide: Improves chemical resistance, lowers thermal expansion, adds elasticity. Works similarly with ZnO. Up to 18 weight percent in E-Glass. Calcium Oxide concentration range: up to 18 weight percent. Magnesium Oxide: This is the upper end in E-glass. May be in the form of $MgCO_3$. Magnesium oxide concentrate range: up to 10 weight percent. Barium Oxide: Improves refractive index of the material without increasing the dispersive power. Used as a replacement for lead or lime. May also come in the form of $BaCO_3$. Barium Oxide concentration range: up to 18 weight percent. Lead Oxide: Improves refractive index of the material without increasing the dispersive power. Lead Oxide concentration range: up to 18 weight percent.

Iron may be added to the melt to make the material paramagnetic (e.g. $Fe_2O_3$). Iron oxide may additionally be used to quench intrinsic autofluorescence of other compounds within the glass. Iron Oxide Concentration range: up to 5 weight percent.

Processing parameters. Patterning of the selected area(s) by at least one process step selected from the group consisting of: Exposure-Exposing the glass substrate to an activating energy source, such as 310 nm light or a directed source of protons.

High anisotropic-etch ratios may be obtained using the photoactive glass of the present invention using a total activation energy between 0.01 J/cm$^2$ and 10 J/cm$^2$ of 310 nm light. In contrast, FOTURAN® sometimes requires up to 85 J/cm$^2$ activation energy to create a uniform exposure across large distances (i.e., inches).

Baking-Baking typically occurs in a two step process. Temperature 1 allows for the coalescing of silver ions into silver nanoparticles and temperature 2 allows for the lithium oxide to form around the silver nanoparticles. However, we have been successful in doing a single ramp step. Etching-Etching is done in an HF solution, typically 5-10 percent by volume. However, we can also add other fluids to the etch solution. For example, we can add hydrochloric or nitric acid to the etch solution. We've had good success in using this solution to obtain a smoother etch because it dissolves the silver nanoparticles. This etch is especially useful in the fabrication of structures and devices that require a smooth surfaces, such as micro-lenses.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, un-recited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), properties(s), method/process steps or limitation(s)) only.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically, and by way of example, although the headings refer to a "Field of Invention," such claims should not be limited by the language under this heading to describe the so-called technical field. Further, a description of technology in the "Background of the Invention" section is not to be construed as an admission that technology is prior art to any invention (s) in this disclosure. Neither is the "Summary" to be considered a characterization of the invention(s) set forth in issued claims. Furthermore, any reference in this disclosure to "invention" in the singular should not be used to argue that there is only a single point of novelty in this disclosure.

Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification, but only by the claims.

The invention claimed is:

1. A method to fabricate a monolithic optical coupler on a single photosensitive glass substrate comprising the steps of:
   providing a photosensitive glass substrate comprising at least silica, lithium oxide, aluminum oxide, cerium oxide, and silver;
   masking a halftone design with variation in optical density to delineate one or more elements in the photosensitive glass substrate, wherein the one or more elements comprise:
   (1) an alignment jig operable to receive a laser diode and align the laser diode with a collimating optical element operable to collimate an output of the laser diode, wherein the collimating optical element is a curved lens or a series of grooves that creates a diffractive lens;
   (2) a cylindrical blind via comprising a controlled termination, wherein the cylindrical blind via is operable to receive an optical fiber and wherein the controlled termination is a curved lens that is curved inward toward a turning mirror and is operable to image the output of the laser diode into the optical fiber;
   masking the photosensitive glass substrate to define a turning mirror in the photosensitive glass substrate;
   exposing the photosensitive glass substrate to an activating energy source;
   exposing the photosensitive glass substrate to a heating phase above its glass transition temperature for at least ten minutes;
   cooling the photosensitive glass substrate to transform at least a portion of the exposed photosensitive glass substrate to a crystalline material to form a glass-crystalline substrate; and
   etching the glass-crystalline substrate with an etchant solution to form the one or more elements.

2. The method of claim 1, wherein the one or more elements comprise one or more micro-lenses.

3. The method of claim 1, wherein the photosensitive glass substrate comprises 60 to 76 weight % silica; at least 3 weight % $K_2O$ with 6 to 16 weight % of a combination of $K_2O$ and $Na_2O$; 0.003 to 1 weight % of at least one oxide selected from the group consisting of $Ag_2O$ and $Au_2O$; 0.003 to 2 weight % $Cu_2O$; 0.75 to 7 weight % $B_2O_3$, and 6 to 7 weight % $Al_2O_3$; with the combination of $B_2O_3$ and $Al_2O_3$ not exceeding 13 weight % 8 to 15 weight % $Li_2O$; and 0.001 to 0.1 weight % $CeO_2$.

4. The method of claim 1, wherein the one or more elements are circular with a high optical density on a perimeter and low optical density in the center.

5. The method of claim 1, wherein the halftone design provides an optical power of the one or more elements.

6. The method of claim 1, wherein the one or more elements comprise one or more patterns of high optical density with concentric circles.

7. The method of claim 1, wherein the one or more elements comprise one or more diffractive patterns of concentric circles.

8. The method claim 7, wherein the one or more diffractive patterns pattern of concentric circles provide provides the optical power of the one or more elements.

9. The method of claim 1, wherein the one or more elements form one or more diffractive optical micro-lenses.

10. A method to fabricate a monolithic optical element on a single photosensitive glass substrate comprising the steps of:
    providing a photosensitive glass substrate comprising at least silica, lithium oxide, aluminum oxide, cerium oxide, and silver;
    masking a digital mask consisting of transparent and non-transparent elements to define one or more elements in the photosensitive glass substrate, wherein the one or more elements comprise:
    (1) an alignment jig operable to receive a laser diode and having a collimating optical element operable to collimate an output of the laser diode, wherein the collimating optical element is a series of grooves that creates a diffractive lens;
    (2) a cylindrical blind via comprising a controlled termination, wherein the blind via is operable to receive an optical fiber and wherein the controlled termination is a curved lens that is curved inward toward a turning mirror and is operable to image the output of the laser diode into the optical fiber;
    masking the photosensitive glass substrate to define a turning mirror in the photosensitive glass substrate;
    exposing at least one portion of the photosensitive glass substrate to an activating energy source;
    exposing the photosensitive glass substrate to a heating phase above its glass transition temperature for at least ten minutes;

cooling the photosensitive glass substrate to transform at least a portion of the exposed photosensitive glass substrate to a crystalline material to form a glass-crystalline substrate; and etching the glass-crystalline substrate with an etchant solution to form the one or more elements.

11. The method of claim 10, wherein the photosensitive glass substrate comprises 60 to 76 weight % silica; at least 3 weight % $K_2O$ with 6 to 16 weight % of a combination of $K_2O$ and $Na_2O$; 0.003 to 1 weight % of at least one oxide selected from the group consisting of $Ag_2O$ and $Au_2O$; 0.003 to 2 weight % $Cu_2O$; $Cu_2O$; 0.75 to 7 weight % $B_2O_3$, and 6 to 7 weight % $Al_2O_3$; with the combination of $B_2O_3$ and $Al_2O_3$ not exceeding 13 weight % 8 to 15 weight % $Li_2O$; and 0.001 to 0.1 weight % $CeO_2$.

12. The method of claim 10, wherein the one or more elements are circular with a high optical density on the perimeter and low optical density in the center, or are one or more micro-lenses comprising a high optical density on the perimeter and a low optical density in the center.

13. The method of claim 10, wherein the transparent and non-transparent design provides the optical power of the one or more elements.

14. The method of claim 10, the one or more elements comprise one or more patterns of high optical density with concentric circles or one or more diffractive patterns concentric circles.

15. The method of claim 14 wherein the one or more diffractive patterns of concentric circles provide the optical power of the one or more elements.

16. The method of claim 10, wherein the one or more elements form one or more diffractive optical micro-lenses.

* * * * *